(12) United States Patent
Fujita et al.

(10) Patent No.: US 9,310,400 B2
(45) Date of Patent: Apr. 12, 2016

(54) CURRENT SENSOR

(71) Applicant: Aisin Seiki Kabushiki Kaisha, Kariya-shi (JP)

(72) Inventors: Noriaki Fujita, Chita-gun (JP); Manabu Kato, Nisshin (JP); Kazuyoshi Mori, Chita-gun (JP)

(73) Assignee: AISIN SEIKI KABUSHIKI KAISHA, Kariya-shi (JP)

( * ) Notice: Subject to any disclaimer, the term of this patent is extended or adjusted under 35 U.S.C. 154(b) by 121 days.

(21) Appl. No.: 14/314,311

(22) Filed: Jun. 25, 2014

(65) Prior Publication Data

US 2015/0042324 A1 Feb. 12, 2015

(30) Foreign Application Priority Data

Aug. 7, 2013 (JP) ................................. 2013-164249

(51) Int. Cl.
*G01R 33/02* (2006.01)
*G01R 19/00* (2006.01)
*G01R 33/09* (2006.01)
(Continued)

(52) U.S. Cl.
CPC ............ *G01R 19/0092* (2013.01); *G01R 15/20* (2013.01); *G01R 33/02* (2013.01); *G01R 33/07* (2013.01); *G01R 33/09* (2013.01); *G01R 33/06* (2013.01)

(58) Field of Classification Search
CPC ........ G01R 33/02; G01R 33/09; G01R 33/07; G01R 33/06; G01R 19/0092
USPC ..................... 324/51, 55, 200, 227, 228–244; 174/32–397
See application file for complete search history.

(56) References Cited

U.S. PATENT DOCUMENTS

| | | |
|---|---|---|
| 6,348,800 B1 | 2/2002 | Haensgen et al. |
| 6,426,617 B1 | 7/2002 | Haensgen et al. |

(Continued)

FOREIGN PATENT DOCUMENTS

| | | |
|---|---|---|
| GB | 2 158 642 A | 11/1985 |
| JP | 2002-243767 | 8/2002 |
| JP | 2012-181208 | 9/2012 |

OTHER PUBLICATIONS

Extended European Search Report issued on Dec. 4, 2014 in Patent Application No. 14174650.3.

*Primary Examiner* — Jermele M Hollington
*Assistant Examiner* — Raul Rios Russo
(74) *Attorney, Agent, or Firm* — Oblon, McClelland, Maier & Neustadt, L.L.P.

(57) ABSTRACT

A current sensor includes a core including groove portions and a separation wall portion, a housing covering the core and including recessed grooves formed along the groove portions, respectively, conductors positioned in the groove portions, respectively, a circuit board fixed to the housing and including a through hole and a land, the through hole penetrating in a direction corresponding to an inserting direction of the conductor, a detection element detecting a magnitude of a magnetic field and positioned in each of recessed grooves to be closer to an opening end of the groove portion relative to the conductor, the detection element being arranged so that a detecting direction of the detection element is directed along a distance direction of the groove portions, the detection element including a connection terminal positioned in the through hole, the connection terminal electrically connected to the land, and a guide portion provided at the housing.

6 Claims, 10 Drawing Sheets

(51) Int. Cl.
  *G01R 33/07* (2006.01)
  *G01R 15/20* (2006.01)
  *G01R 33/06* (2006.01)

(56) References Cited

U.S. PATENT DOCUMENTS 8,810,235 B2* 8/2014 Ueno .................. G01R 15/207
                                              324/117 H 2005/0030004 A1  2/2005  Takatsuka et al.
2006/0043960 A1  3/2006  Itoh et al.
2008/0048642 A1  2/2008  Aratani et al.
2010/0259248 A1* 10/2010 Labbe .................. G01R 15/207
                                              324/151 R
2011/0068771 A1* 3/2011  Ueno .................. G01R 15/202
                                              324/117 R
2012/0306486 A1  12/2012 Racz et al.

* cited by examiner

CURRENT SENSOR

CROSS REFERENCE TO RELATED APPLICATIONS

This application is based on and claims priority under 35 U.S.C. §119 to Japanese Patent Application 2013-164249, filed on Aug. 7, 2013, the entire content of which is incorporated herein by reference.

TECHNICAL FIELD

This disclosure generally relates to a current sensor.

BACKGROUND DISCUSSION

A known current sensor which includes a magnetic detection element, for example, a Hall element, has been used for measuring the electric current in a conductor. According to such current sensors, a positional relationship between a flux concentrating core that concentrates magnetic fluxes and the magnetic detection element that detects the magnetic flux density of the flux concentrating core significantly influences on a downsizing of a current sensor and a precision of an electric current detection. Thus, positioning the flux concentrating core and the magnetic detection element with high precision is desired. Further, in a case where a lead (wire) serves as a terminal of the magnetic detection element, it is desired to appropriately connect the lead (wire) to, for example, a land of a circuit board because a joining state of the lead (wire) and the circuit board significantly influences on a reliability (quality attributes) of the current sensor. For example, JP2002-243767A (hereinafter referred to as Patent reference 1) and JP2012-181208A (hereinafter referred to as Patent reference 2) disclose the types of known current sensors or devices explained above.

According to the electric current detection device disclosed in Patent reference 1, a core having a substantially rectangular shape in cross-section which is provided with a gap at one of four sides is fixed in a case. A Hall IC positioned in the gap detects changes in the magnetic flux generated at the core. A lead (wire) of the Hall IC is formed in a predetermined configuration, and is directly connected to connector terminals for input and output that are integrally formed with the case.

According to the current sensor disclosed in Patent reference 2, a substantially ring shaped core having a gap with a predetermined distance is integrally formed with a resin-made case, at least a portion of the gap is exposed to an accommodation portion of the resin-made case, and a magneto-electric converting element mounted on a circuit board housed in the accommodation portion is positioned at the gap. A lead type magneto-electric converting element in which a lead (wire) protrudes from a mold portion is applied as the magneto-electric converting element. The mold portion includes a tapered portion which is formed to be thinner in a distance direction of the gap as being away from the circuit board in a thickness direction of the circuit board. At least a portion of tapered outer surface of the tapered portion faces end surfaces of the core in the distance direction of the gap.

The electric current detection device disclosed in Patent reference 1 does not define the positional relationship between the core and the Hall IC. Thus, by a variation, or unevenness of a bend dimension when forming the lead of the Hall IC, the positional relationship between the core and the Hall IC greatly fluctuates and significantly influences on a precision in current detection. Further, because the Hall IC is not fixed relative to the core, when the Hall IC moves, for example, by vibrations, the precision in detection may be affected and there is a possibility that the electric current cannot be measured with high precision, or accuracy. As an alternative structure, a fixing member may be applied to fix the Hall IC relative to the core, however, this construction increases manufacturing costs.

According to the electric current sensor disclosed in Patent reference 2, when soldering the lead (wire) to the circuit board, the lead has to be directly inserted through a through hole of the circuit board, and a stress is generated at the lead if the lead is inserted through the through hole and soldered in a state where the position of the lead and the position of the through hole is offset, or not aligned. When the vibration and/or thermal shock (flame impingement) occurs in the foregoing state, portions soldered in accordance with a difference in linear coefficient of expansion of each of the magneto-electric converting element, the circuit board, and the resin-made case may be fatigued by repetitive stresses to causes problems in durability.

A need thus exists for a current sensor which is not susceptible to the drawback mentioned above.

SUMMARY

In light of the foregoing, the disclosure provides a current sensor which includes a core, the core being made from magnetic member, the core including plural groove portions and at least one separation wall portion separating the groove portions from one another, a housing, the housing being made from a non-magnetic material, the housing covering the core along a contour of the core, the housing including plural recessed grooves formed at the housing along the groove portions, respectively, plural conductors, the conductors positioned in the groove portions, respectively, the conductors allowing a current being measured to flow therein, a circuit board, the circuit board fixed to the housing, the circuit board including a through hole and a land formed at a surrounding of the through hole, the through hole penetrating through the circuit board in a direction corresponding to an inserting direction of the conductor, a detection element, the detection element detecting a magnitude of a magnetic field generated in accordance with the current being measured flowing in the conductors, the detection element positioned in each of the recessed grooves, the detection element positioned closer to an opening end side of the groove portion relative to the conductor positioned in the groove portion, the detection element being arranged so that a detecting direction of the detection element is directed along a distance direction of the groove portions, the detection element including a connection terminal, the connection terminal inserted and positioned in the through hole, the connection terminal electrically connected to the land, and a guide portion, the guide portion provided at the housing, the guide portion guiding the connection terminal to the through hole.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

One embodiment of current sensor will be explained with reference to illustrations of drawing figures as follows. The current sensor of the embodiment is configured to measure a current being measured which flows in a conductor. Here, when the electric current flows in the conductor, a magnetic field is generated about the conductor as an axis center in accordance with a degree of the electric current (Ampere's law). The current sensor of the embodiment detects magnitude, or strength of the magnetic field, and measures electric current (current value) flowing in the conductor on the basis of the magnitude, or strength of the detected magnetic field.

Figure 1:
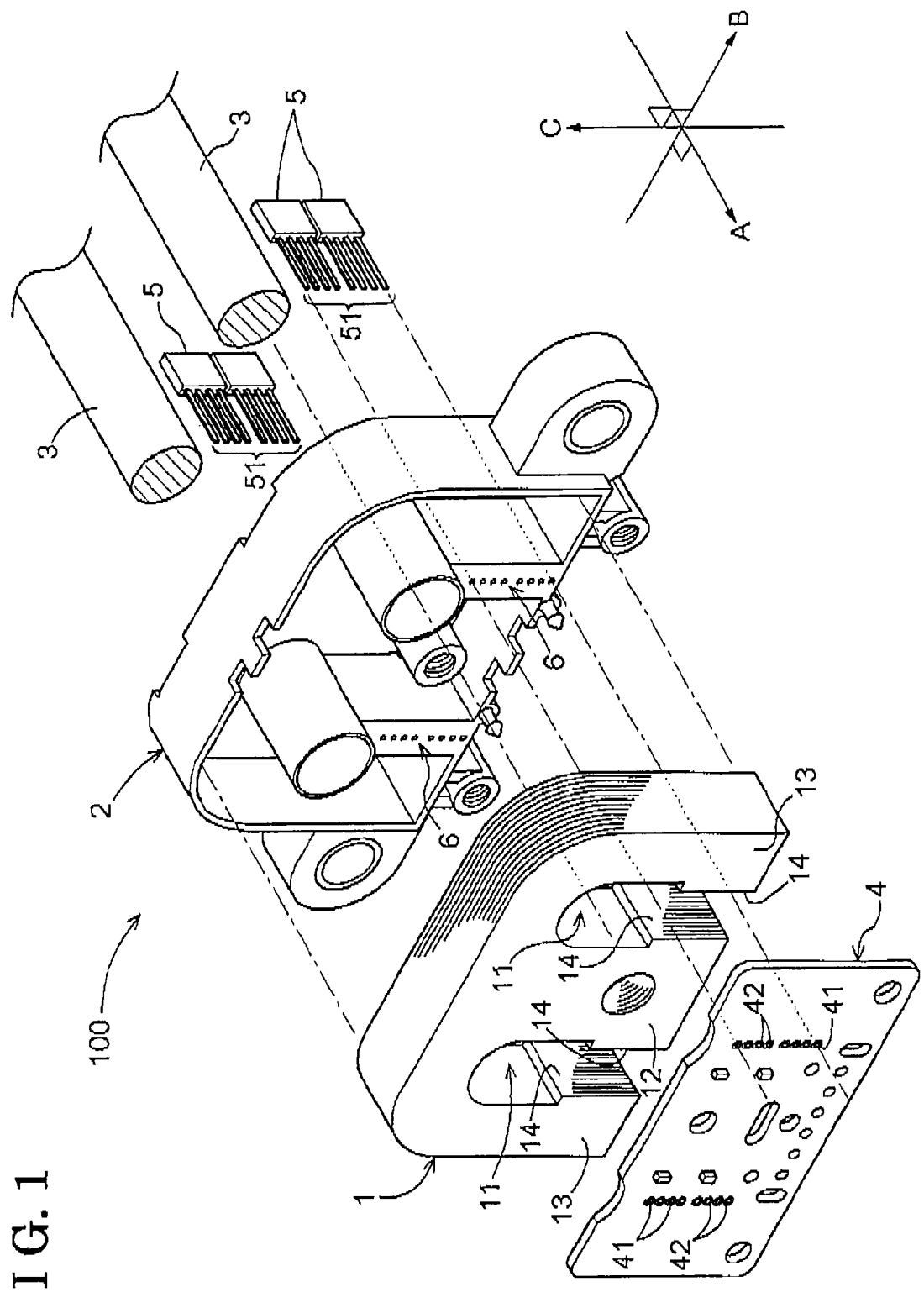
FIG. 1 shows an exploded perspective view of a current sensor according to an embodiment disclosed here.
Figure 2:
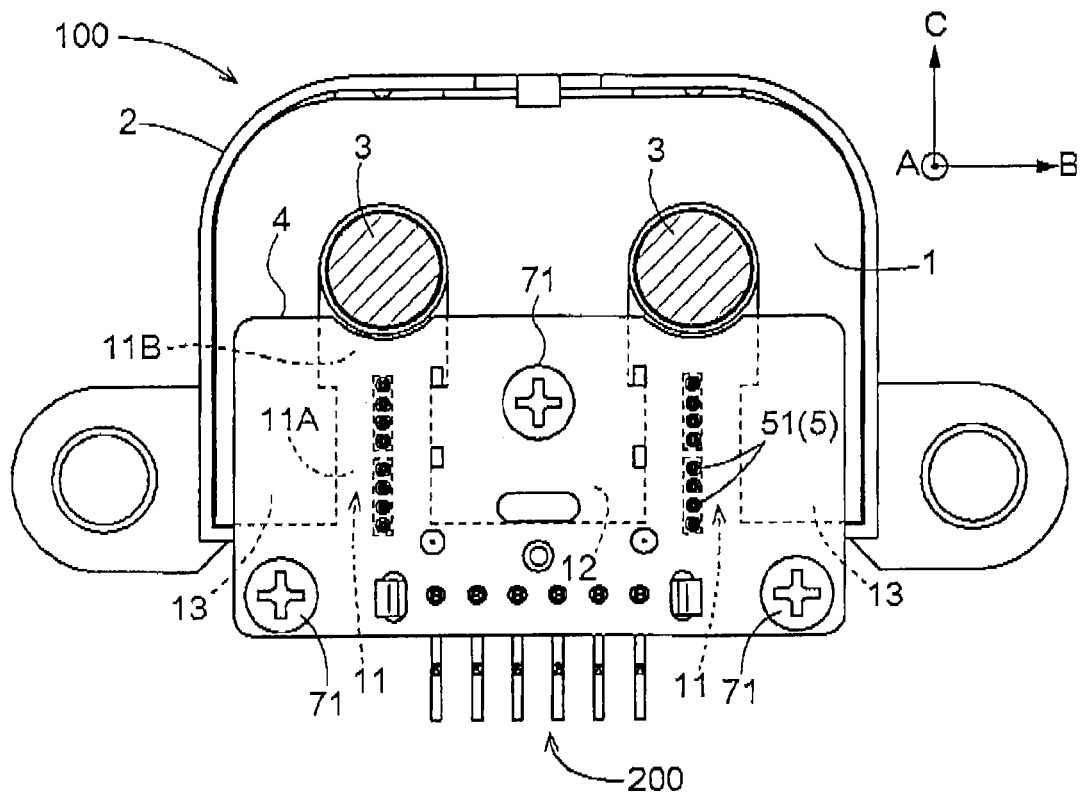
FIG. 2 shows a schematic front view of the current sensor according to the embodiment disclosed here.
Figure 3:
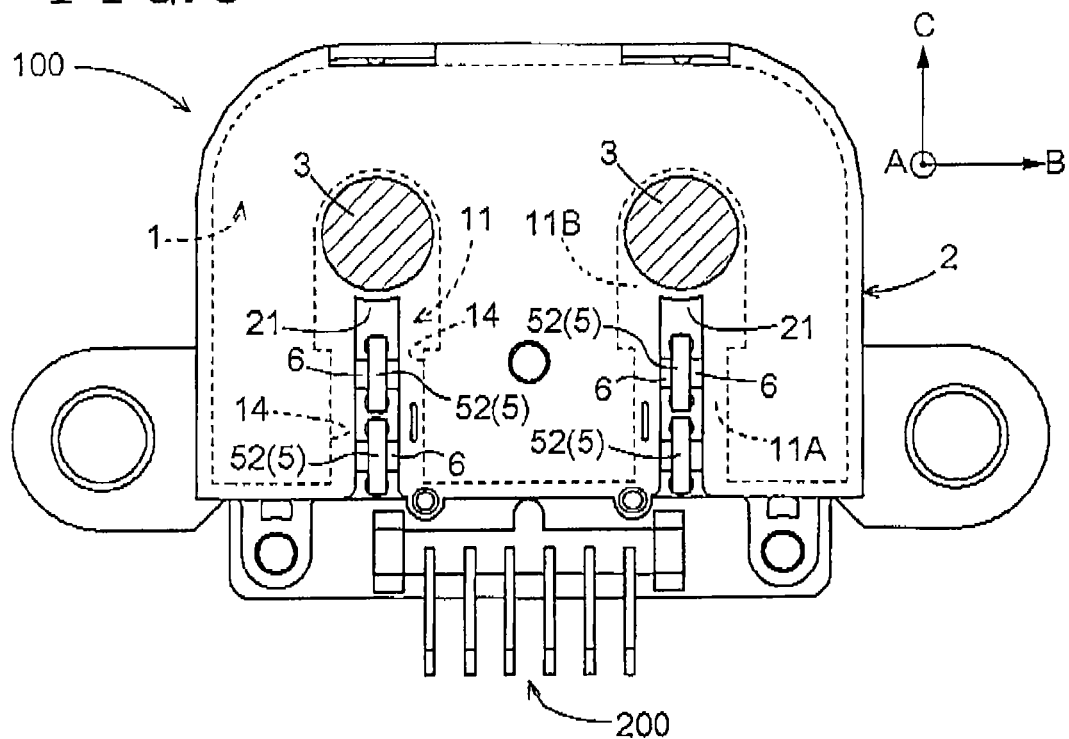
FIG. 3 shows a schematic rear view of the current sensor according to the embodiment disclosed here.

FIG. 1 shows an exploded perspective view of a current sensor 100. Two conductors 3 made from pillar shaped conductors are shown in FIG. 1. For an explanatory purpose, a direction that the conductor 3 extends is defined as an extending direction A, a distance direction, or spacing direction between the conductors 3 is defined as a distance direction B, and a direction orthogonal to the extending direction A and the distance direction B is defined as a direction C. FIG. 2 shows a schematic view of the current sensor 100 viewed from a circuit board 4 in the extending direction A of the conductor 3. FIG. 3 shows a schematic view of the current sensor 100 viewed from an opposite direction from the extending direction A of the conductor 3 in FIG. 2. FIGS. 2 and 3 show a connector 200 used for supplying electric power to the current sensor 100 and for outputting detecting results, for example.

As illustrated in FIG. 1, a core 1 includes plural groove portions 11 and a separation wall portion 12 separating the groove portions 11. An outer wall portion 13 is provided at each of opposite outermost sides of the plural groove portions 11. As illustrated in FIGS. 1 and 2, according to the embodiment, the core 1 includes two groove portions 11 each formed in a substantially U-shape. Thus, the core 1 of the embodiment includes one separation wall portion 12. A protrusion portion 14 is provided at each of the separation wall portions 12 and the outer wall portions 13. The protrusion portion 14 is positioned protruding in the distance direction B so that an opening width at an opening portion 11A of the groove portion 11 is assumed to be narrower than an opening width at a bottom portion 11B. The core 1 is made from a magnetic member. The core 1 according to the embodiment is formed by stacking, or laminating plane plates made from metal magnetic member having the groove portion 11 in the direction A in FIGS. 1 to 3. The metal magnetic member corresponds to a soft magnetic metal, for example, an electromagnetic steel plate (silicon steel pate), permalloy, and permendur.

The housing 2 covers the core 1 along a contour of the core 1. That is, the housing 2 houses the core 1 along a configuration of the core 1. Thus, inner wall portions of the groove portion 11 of the core 1 that face each other are covered with the housing 2. The housing 2 made of resin that is non-magnetic material. Accordingly, the core 1 and conductors 3 can be insulated from each other.

The plural conductors 3 are positioned through (inserted through) the plural groove portions 11, respectively. The current being measured flows in the conductors 3. As described above, two conductors 3 are provided according to the embodiment. The conductors 3 are inserted to be positioned through the corresponding two grooves 11 of the core 1, respectively. As described above, the core 1 is covered with the housing 2. Thus, the conductor 3 is positioned through the groove portion 11 of the core 1 via the housing 2. For example, a bus bar that is applied for connecting a three-phase motor and an inverter that energizes the three-phase motor serves as the conductor 3. The current being measured flows in the conductors 3 in the direction A, and the current sensor 100 measures, or detects the electric current in the conductor 3. According to the embodiment, two conductors 3 are provided. Further, according to the embodiment, two currents of three-phase alternating current serve as the current being measured.

The circuit board 4 includes through holes 41 formed directed in a direction which accords with an insertion direction of the conductor 3, and a land 42 formed surrounding each of the through holes 41. The circuit board 4 is fixed to the housing 2. The through hole 41 penetrates through the circuit board 4 in a thickness direction of the circuit board 4. According to the embodiment, the land 42 is formed surrounding each of the through holes 41 on front and back surfaces of the circuit board 4. A surface of the circuit board 4 which is mounted facing the core 1 is defined as the front surface of the circuit board 4. A surface of the circuit board 4 which faces the opposite direction from the core 1 is defined as the back surface of the circuit board 4.

The land 42 is formed surrounding the through hole 41, that is, the land 42 is formed at surrounding, or circumference of the through hole 41 about the through hole 41 as a center and along the front surface or the back surface of the circuit board 4. By inserting connection terminals 51 of a detection element 5 through the through hole 41 and soldering the land 41 at the back surface of the circuit board 4, a solder fillet is formed at each of the lands 42 at the front surface and rear surface of the circuit board 4. Further, the solder enters the through hole 41, or the through hole 41 is filled with the solder. Accordingly, fixing strength of the soldering of the connection terminals 51 relative to the circuit board 4 can be enhanced.

The through hole 41 is arranged in a direction that accords with the insertion direction of the conductor 3. That is, an axis of the through hole 41 and the insertion direction of the conductor 3 are in parallel with each other. In those states, the circuit board 4 is fixed to the housing 2. According to the embodiment, the circuit board 4 is fastened to the housing 2 by means of screws 71 (for example, three screws 71).

The detection element 5 includes the connection terminals 51 electrically connected to the lands 42 in a state each being inserted through the through hole 41. According to this construction, the electric power is supplied to the detection element 5 from the circuit board 4, and detection signals can be transmitted from the detection element 5 to the circuit board 4.

The detection element 5 is positioned at a recessed groove 21 formed at the housing 2 along the groove portion 11. Further, the detection element 5 is positioned at an opening portion 11A side of the groove portion 11 relative to the conductor 3 positioned in the groove portion 11 of the core 1 so that a detecting direction is directed along the distance direction B (i.e., the direction B) of the groove portion 11. A groove formed at the housing 2 along the configuration of the groove portion 11 of the core 1 as a result of covering the separation portion 12 and the outer wall portion 13 of the core 1 that face each other with the housing 2 by a predetermined thickness is defined as the recessed groove 21 formed at the housing 2 along the groove portion 11. As described above, the detection element 5 is positioned at the opening portion 11A side of the groove portion 11 relative to the conductor 3 positioned in the groove portion 11 of the core 1. That is, referring to the groove portion 11 of the core 1 housed in the housing 2 as a point of reference, the detection portion 5 is positioned closer to the opening portion 11A compared to the conductor 3 positioned through the groove portion 11 of the core 1. The position where the detection element 5 is positioned corresponds to a position that is interposed, or sandwiched between the protrusion portions 14 of the core 1. In those circumstances, the magnetic field generated in accordance with the electric current flowing in the conductor 3 is concentrated (i.e., the magnetic flux is concentrated) at a side closer to the opening portion of the core 1 from an upper end of the conductor 3 of the groove portion 11 of the core 1. The concentrated magnetic filed corresponds to a magnetic field directed in the distance direction B (i.e., the direction B) of the groove portion 11 of the core in the vicinity of the detection element 5. Similar magnetic field is generated at the recessed groove 21 of the housing 2.

The detection element 5 is arranged so that a detection direction accords with the direction B. Thus, the intensity of the magnetic field generated by the current being measured flowing in the conductor 3 is assumed to be effectively detectable. A magnetic field that is generated in a radial direction from the center of the axis of the conductor 3 in response to the current being measured flowing in the conductor 3 is defined as the magnetic field generated by the current being measured. According to the embodiment, two detection elements 5 are provided for each of the groove portions 11 of the core 1. That is, because two groove portions 11 are provided according to the embodiment, four detection elements 5 are provided. In those circumstances, the detection elements 5 positioned in the common groove portion 11 detect the magnetic flux density directed in the same direction. Thus, in a case where detection signals of the detection elements 5 positioned in the common groove portion 11 show the magnetic flux densities directed in different directions and in a case where detection results of the detection elements 5 positioned in the common groove portion 11 are significantly deviated relative to a predetermined deviation level, it is determined that one of the detection elements 5 is in failure. In order to determine the failure explained above, according to the embodiment, two detection elements 5 are positioned in the same groove portion 11.

A guide portion 6 is provided at the housing 2. The guide portion 6 guides the detection element 5 to a predetermined fixing position. The predetermined fixing position is defined as a position where the detection element 5 is interposed, or sandwiched between the protrusion portions 14 described above along the direction B. The guide portion 6 is configured to guide the detection element 5 to such position.

Figure 4:
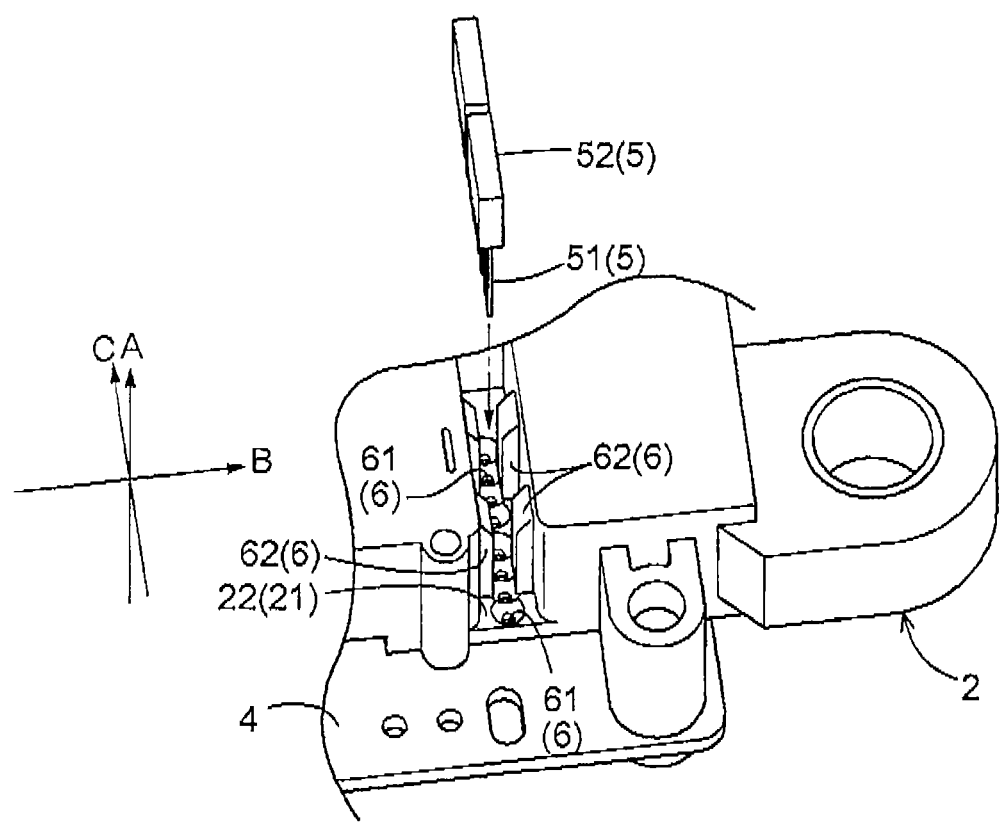
FIG. 4 shows a perspective view of a guide portion of the current sensor according to the embodiment disclosed here.

Referring to FIG. 4, constructions of the guide portion 6 will be explained hereinafter. According to the embodiment, the guide portion 6 includes hole portions 61 and protrusion portions 62. As illustrated in FIG. 4, the hole portions 61 and the protrusion portions 62 are provided at the recessed groove 21 of the housing 2. The hole portions 61 are provided at a side opposite from the side facing the circuit board 4 at the recessed groove 21 (the hole portions 61 are provided at a side opposite from the circuit board 4 at a portion of the recessed groove 21 opposing to the circuit board 4), and are formed so that a diameter is reduced towards an inner in an inserting direction of the connection terminal 51 (i.e., so that the diameter is reduced in a direction from the connection terminal 51 to the circuit board 4 in a state where the connection terminal 51 is positioned through the hole portion 61). The portion of the recessed groove 21 opposing to the circuit board 4 corresponds to a side surface portion 22 that is adjacent to the circuit board 4 at the recessed groove 21. The side opposite from the circuit board 4 corresponds to a surface that is opposite from a surface that faces the circuit board 4 at the side surface portion 22, that is, corresponds to a side that faces the inside of the recessed groove 21. In those circumstances, the connection terminals 51 of the detection element 5 are inserted in the recessed groove 21 towards the circuit board 4 in a direction orthogonal to the circuit board 4. Thus, that the diameter is reduced towards the inner in the inserting direction of the connection terminal 51 is defined as that a diameter of the hole portion 61 is reduced as being closer to the circuit board 4 from the recessed groove 21 at the side surface portion 22. The through holes 41 of the circuit board 4 are positioned corresponding to the hole portions 61 keeping a predetermined distance from and facing the hole portions 61. Thus, the connection terminals 51 can be guided through the through holes 41, respectively.

Figure 5:
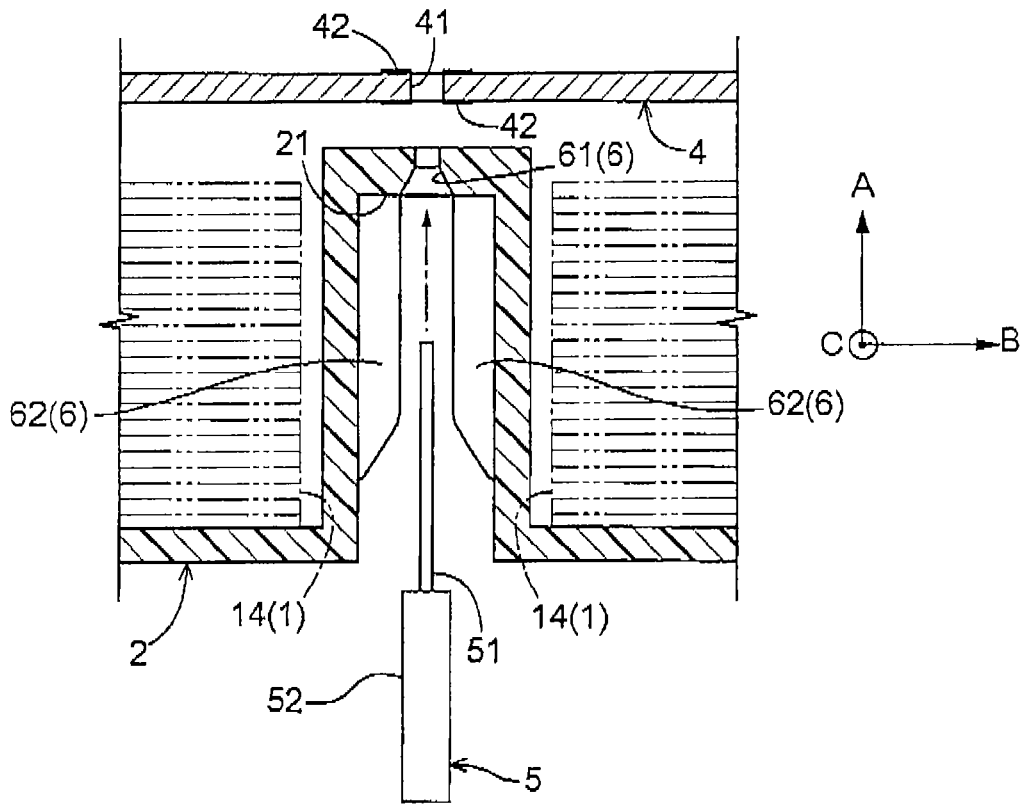
FIG. 5 shows a side view of the guide portion of the current sensor according to the embodiment disclosed here.

Further, protrusion portions 62 are provided protruding in a distance direction (gap direction, spacing direction) of the recessed groove 21 in the recessed groove 21, and a protrusion amount of the protrusion portion 62 increases from an outer side to an inner side in an inserting direction of the connection terminal 51 (the protrusion amount of the protrusion portion 62 increases in the direction from the connection terminal 51 to the circuit board 4 in a state where the connection terminal 51 is positioned through the hole portion 61). The distance direction of the recessed groove 21 corresponds to the distance direction of the groove portion 11 of the core 1, and thus corresponds to the direction B in FIGS. 4 and 5. The detection element 5 includes the connection terminals 51 and mold portions 52 to which Hall elements connected to the connection terminals 51 are enclosed with resin. The protrusion portions 62 that face each other in the direction B are formed so that an opening width between the protrusion portions 62 facing each other at an opening end corresponds to a width (length in the direction B) of the mold portion 52 of the detection element 5 and the opening width is gradually narrowed towards the inner in the inserting direction of the connection terminal 51 (in the direction from the connection terminal 51 to the circuit board 4 in a state where the connection terminal 51 is positioned through the hole portion 61). Thus, the mold portion 52 of the detection element 5 can be guided to the predetermined fixing position.

Figure 6:
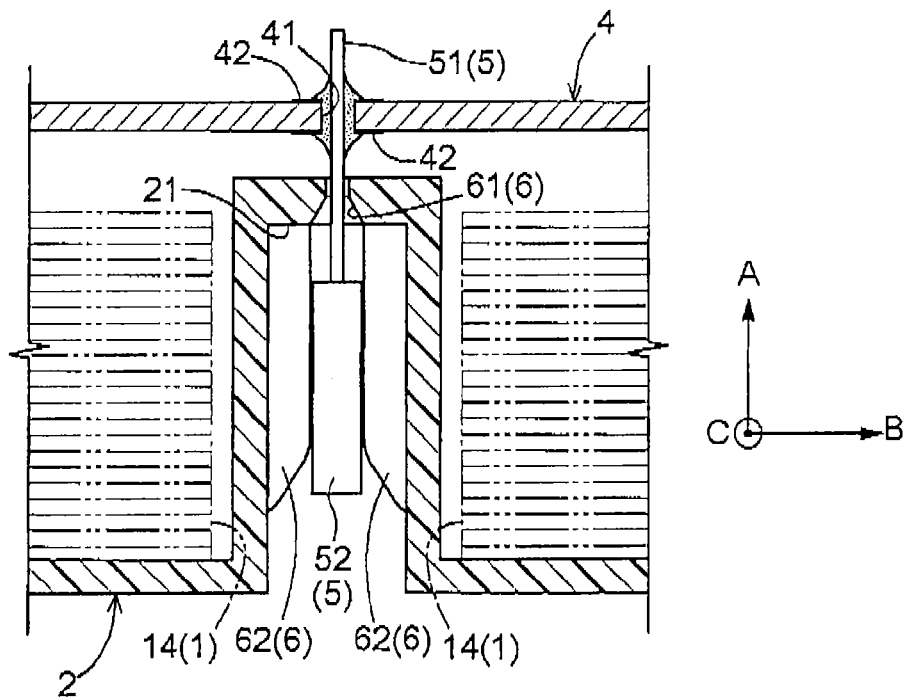
FIG. 6 shows a side view illustrating a detection element soldered on a circuit board of the current sensor according to the embodiment disclosed here.

According to the current sensor 100 of the embodiment, a clearance is provided between the housing 2 and the circuit board 4 in a state where the circuit board 4 is fixed to the housing 2. As described above, the circuit board 4 is fastened to the housing 2 by means of the screws 71. As illustrated in FIG. 6, the circuit board 4 is positioned keeping a distance from (away from) the housing 2 at portions other than the portions that are fastened by the screws 71. According to this construction, solder fillets formed at the lands 42 on the front and back sides of the circuit board 4 can be seen via the clearance in a direction orthogonal to a thickness direction of the circuit board 4. Thus, whether the soldering is properly applied can be visually inspected (confirmed by the visual inspection, for example).

Figure 7:
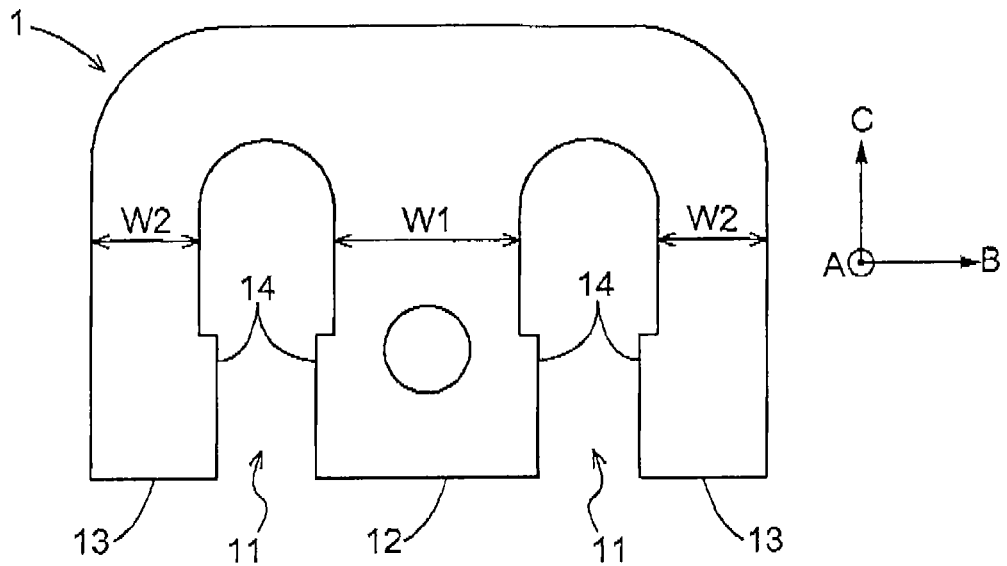
FIG. 7 shows a front view of a core of the current sensor according to the embodiment disclosed here.

According to the embodiment, the core 1 includes one separation wall portion 12 and two outer wall portions 13. As illustrated in FIG. 7, the length of the separation wall portion 12 in the distance direction is set to be longer than the length of the outer wall portion 13 in the distance direction. Here, the distance direction is defined as the distance direction of the groove portion 11 of the core 1, that is, corresponds to the direction B in FIG. 7. Thus, the length of the separation wall portion 12 in the distance direction corresponds to W1 in FIG. 7. The length of the outer wall portion 13 in the distance direction corresponds to W2 in FIG. 7. The separation wall portion 12 and the outer wall portion 13 are structured so that W1 is greater than W2 (W1>W2).

Figure 8:
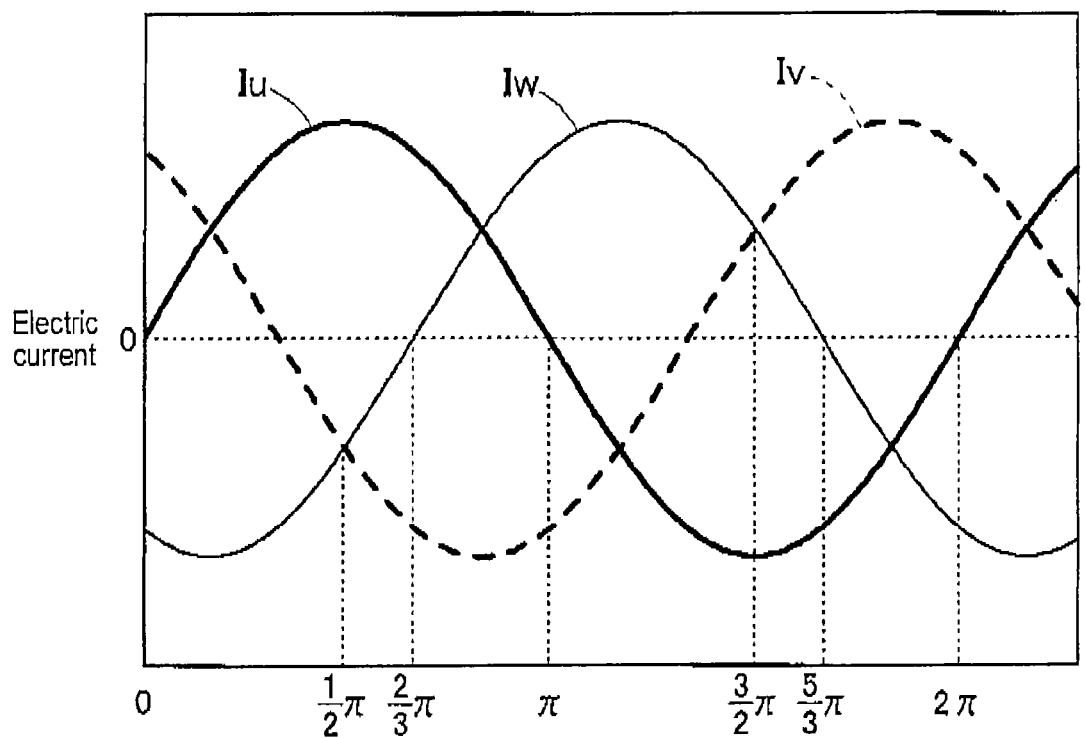
FIG. 8 shows a current waveform of a three-phase alternating current.

Particularly, it is favorable that the length of the separation wall portion 12 is set to be equal to or greater than the length of the outer wall portion 13 multiplied by the square root of three (the length of the outer wall portion 13 multiplied by $\sqrt{3}$). The reason will be explained hereinafter, FIG. 8 shows a current waveform of the three-phase alternating current. Currents flowing in two conductors 3 of the three-phase alternating current are defined as U-phase and V-phase. In case of detecting the magnetic flux generated by the electric current flowing in two conductors 3, the core 1 saturates when |Iu−Iv| is maximized. In those circumstances, Iu corresponds to the electric current of U-phase, Iv corresponds to the electric current of V-phase, and Iw corresponds to the electric current of W-phase.

The electric current flowing in two conductors 3 are shown in equation 1 and equation 2 as follows.

$$Iu = A \cdot \sin\omega t \qquad \text{[Equation 1]}$$

$$Iu = A \cdot \sin\left(\omega t + \frac{2}{3}\pi\right) \qquad \text{[Equation 2]}$$

Equation 2 is expressed in Equation 3 by the addition theorem.

$$Iv = A \cdot \left(\sin\omega t \cdot \cos\frac{2}{3}\pi + \cos\omega t \cdot \sin\frac{2}{3}\pi\right) \qquad \text{[Equation 3]}$$

On the other hand, when the core 1 is saturated, Equation 4 is established.

$$Iu - Iv = A \cdot \sin\omega t - A \cdot \left(\sin\omega t \cdot \cos\frac{2}{3}\pi + \cos\omega t \cdot \sin\frac{2}{3}\pi\right) \qquad \text{[Equation 4]}$$

Thus, Equation 5 is attained when the core is saturated.

$$Iu - Iv = \frac{3}{2}A \cdot \sin\omega t - \frac{\sqrt{3}}{2}A \cdot \cos\omega t \qquad \text{[Equation 5]}$$

By differentiating Equation 5 with respect to time t, Equation 6 is attained.

$$\frac{d(Iu - Iv)}{dt} = \frac{3}{2}A\omega \cdot \cos\omega t + \frac{\sqrt{3}}{2}A\omega \cdot \sin\omega t \qquad \text{[Equation 6]}$$

Here, in a case where the left-hand side of Equation 6 is zero (0), Equation 7 is attained.

$$\tan\omega t = -\sqrt{3} \qquad \text{[Equation 7]}$$

Solving Equation 7 for ωt, Equation 8 is attained.

$$\omega t = \frac{2}{3}\pi + n\pi \qquad \text{[Equation 8]}$$

According to Equation 8, the core 1 is saturated every 180 degrees with reference to 120 degrees (saturation points of the core 1 are provided every 180 degrees with 120 degrees as a reference). For example, in a case where the electric current flowing in the conductors 3 is ±900A, the magnetic flux corresponding to 900A multiplied by $\sqrt{3}$ flows in the separation wall portion 12.

Figure 9:
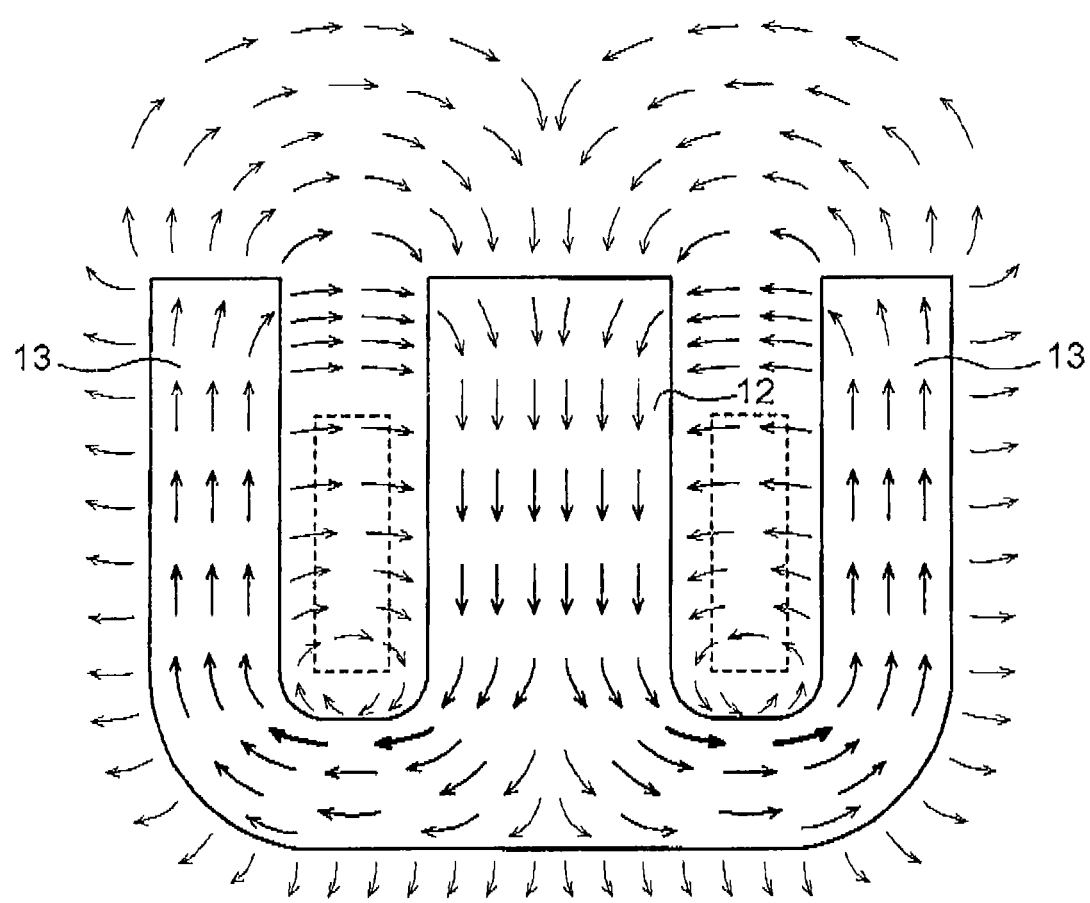
FIG. 9 shows simulation results of magnetic flux density of the current sensor according to the embodiment disclosed here.
Figure 10:
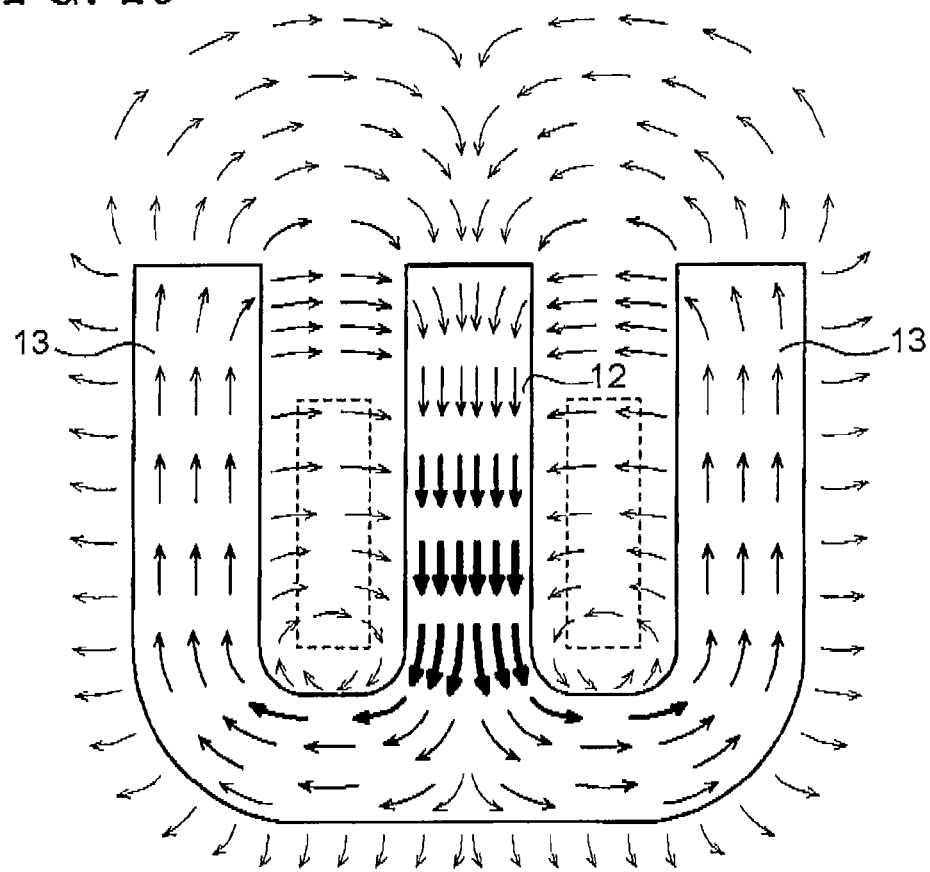
FIG. 10 shows simulation results of magnetic flux density of a current sensor in a case where a length of a separation wall is changed according to a comparison example.

FIG. 9 shows a simulation result of the magnetic flux generated at the core 1 when the length of the separation wall portion 12 in the distance direction corresponds to the length of the outer wall portion 13 in the distance direction multiplied by $\sqrt{3}$. As a comparison example, FIG. 10 shows a simulation result of the magnetic flux generated at the core 1 when the length of the separation wall portion 12 in the distance direction is equal to the length of the outer wall portion 13 in the distance direction. In FIGS. 9 and 10, directions of arrows correspond to directions of magnetic flux, and thickness of the arrows corresponds to the level, or degree of the magnetic flux density. Thus, the thicker the arrow is, the higher the flux density is, and the thinner the arrow is, the lower the flux density is. In FIGS. 9 and 10, through holes through which the screws 71 are penetrated and the protrusion portions 14 are not shown for an explanatory purpose.

As shown in FIG. 10, when the length of the separation wall portion 12 of the core 1 in the distance direction is equal to the length of the outer wall portion 13 in the distance direction, the magnetic flux density at the separation wall portion 12 is assumed to be higher. In those circumstances, magnetic fluxes generated by two conductors 3 at the separation portion 12 of the core 1 influence each other so that the detection element 5 provided at the groove portion 11 of the core 1 cannot detect the magnetic flux precisely.

On the other hand, as shown in FIG. 9, when the length of the separation wall portion 12 of the core 1 in the distance direction is longer than the length of the outer wall portion 13 in the distance direction, the magnetic flux density at the separation wall portion 12 is lower compared to the example shown in FIG. 10. In those circumstances, magnetic fluxes generated by two conductors 3 at the separation portion 12 of the core 1 do not influence each other, and thus, the detection element 5 provided at the groove portion 11 of the core 1 detects the magnetic flux with high precision.

As shown in FIG. 8, a phase difference of the electric current of the three-phase alternating current is 120 degrees and a phase difference of the magnetic fluxes generated at two of the conductors 3 is 120 degrees. Thus, in order to minimize the dimension of the core 1, it is favorable that the length of the separation wall portion 12 in the distance direction corresponds to the length of the outer wall portion 13 in the distance direction multiplied by $\sqrt{3}$. The length of the outer wall portion 13 in the distance direction may be changed as desired. For example, the outer wall portion of the core may be defined to be longer than the length of the outer wall portion 13 in the distance direction of the embodiment described above and the length of the separation wall portion 12 in the distance direction may be defined to be equal to the length of the outer wall portion 13 in the distance direction. As long as the magnetic fluxes do not influence each other, the foregoing alternative construction is applicable. In other words, the length of the separation wall portion 12 of the core 1 in the distance direction and the length of the outer wall portion 13 in the distance direction can be changed in accordance with the magnetic flux density generated by the electric current flowing in the conductors 3 and the dimension of the current sensor 100.

Figure 11:
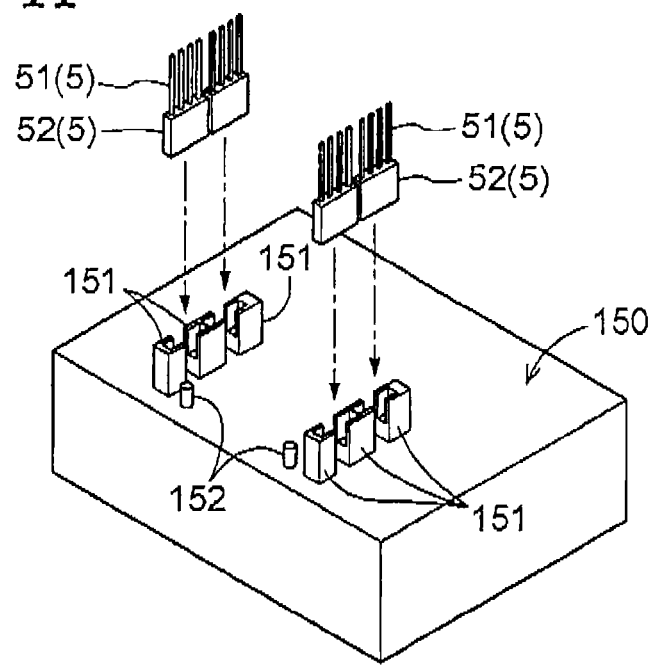
FIG. 11 shows a jig used for manufacturing the current sensor according to the embodiment disclosed here.

A method for manufacturing the current sensor 100 will be explained as follows. A jig 150 as illustrated in FIG. 11 is applied for manufacturing the current sensor 100. Support portions 151 are provided at a predetermined surface of the jig 150. The support portion 151 supports the detection elements 5 in a state where the detection elements 5 are positioned in the mold portion 52. The support portions 151 are formed so that connection terminals 51 are provided standingly in a state where the mold portion 52 is inserted and positioned in the support portion 151. The position of the support portion 151 is determined in accordance with the position of the through holes 41 so that the connection terminals 51 of the detection element 5 that is positioned in the support portion 151 are provided through the through holes 41 at the circuit board 4. Further, protrusion portions 152 that are fitted to positioning holes of the housing 2 are formed at the surface of the jig 150 at which the support portions 151 are formed. Accordingly, the connection terminals 51 that are provided standingly are readily inserted through the through holes 41.

Figure 12:
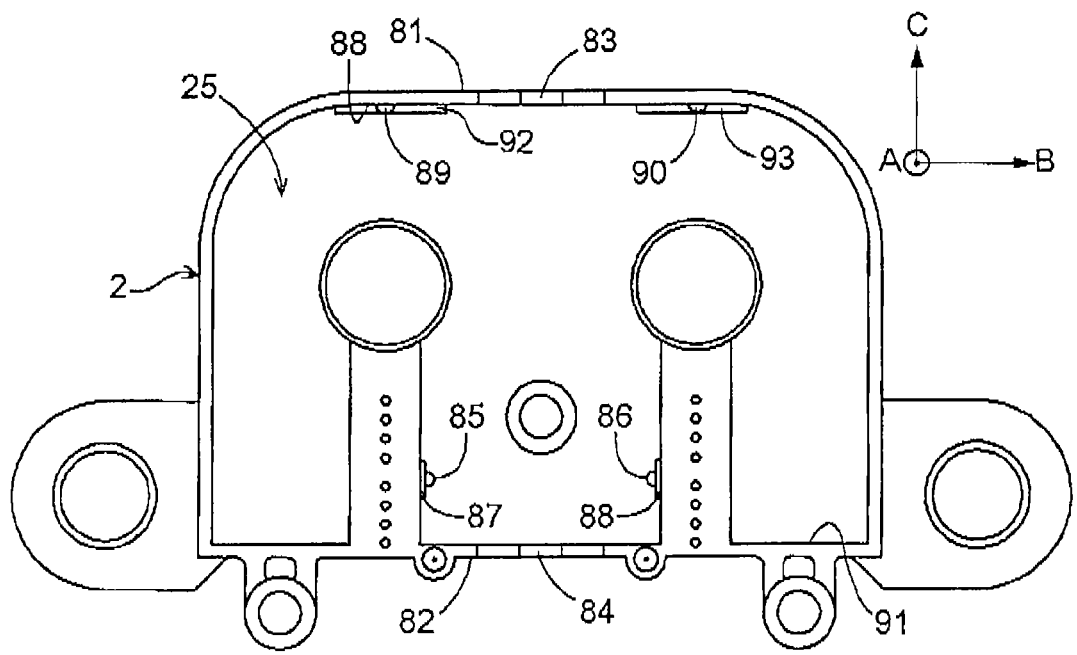
FIG. 12 shows a front view of a housing according to the embodiment disclosed here.
Figure 13:
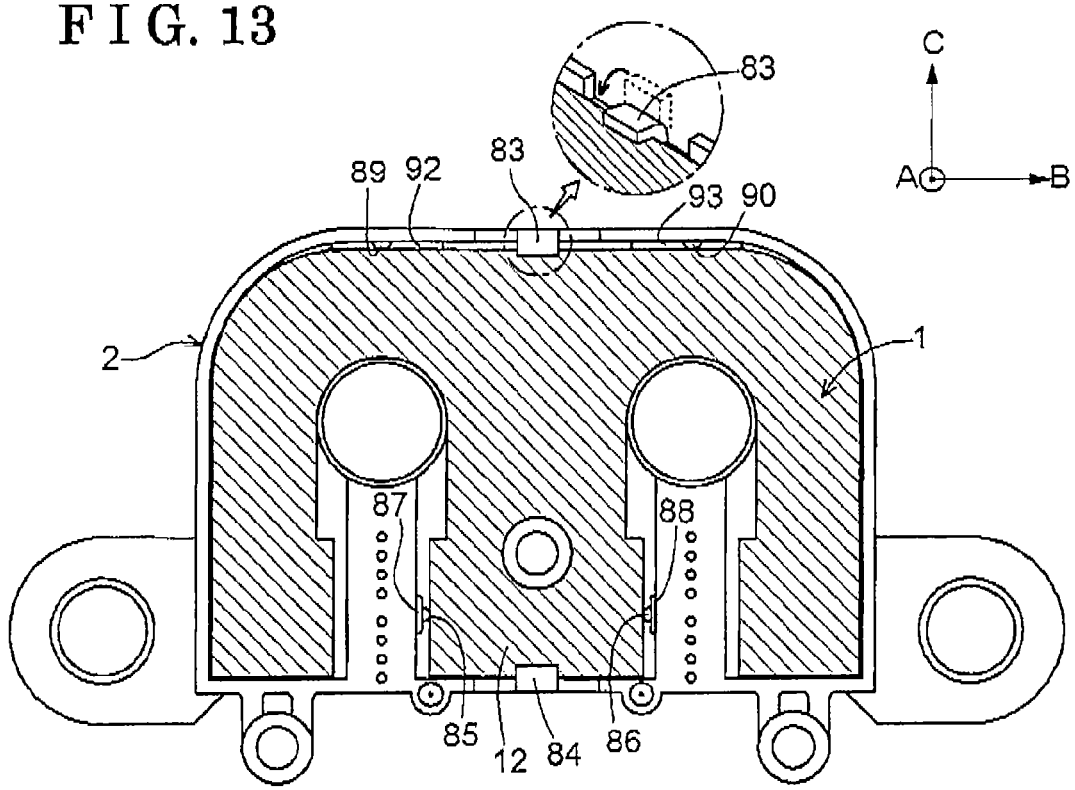
FIG. 13 shows a front view of the housing to which the core is mounted according to the embodiment disclosed here.

The core 1 is housed in the housing 2 and is assembled, for example, by press-fitting and thermal clinching. Protrusion walls 83, 84 are formed at wall portions 81, 82, respectively, that are in parallel with A-B surface along the direction A among the wall portion provided standingly from a bottom surface 25 of the housing 2. The core 1 is supported by the housing 2 in the direction A by means of the protrusion walls 83, 84. More particularly, the core 1 is fixed to the housing 2 by bending the protrusion walls 83, 84 towards the core 1 along the direction C by the thermal clinching in a state where the core 1 is housed in the housing 2 and the core 1 is pushed to the bottom surface 25 of the housing 2 (see FIGS. 12 and 13).

Pillar shaped protrusion portions 85, 86 are formed to protrude from the bottom surface 25 of the housing 2 along the direction A to face A-C surface of the separation wall portion 12 of the core 1 housed in the housing 2. The core 1 is supported by the housing 2 in the direction B by means of the pillar shaped protrusion portions 85, 86. More particularly, a distance between the pillar shaped protrusion portion 85 and the pillar shaped protrusion portion 86 in the direction B is set to be slightly shorter than the length of the separation wall portion 12 of the core 1 in the direction B. Accordingly, when the core 1 is housed in the housing 2, the separation wall portion 12 of the core 1 is supported by the pillar shaped protrusion portions 85, 86 at the opposite ends thereof in the direction B. Thus, by maintaining the dimension of the separation wall portion 12, which is supported in the foregoing manner, in the direction B to have high precision, the positioning of the core 1 relative to the housing 2 in the direction B can be performed accurately. In a state where the core 1 is housed in the housing 2, the pillar shaped protrusion portions 85, 86 are expanded outwardly in the direction B by the core 1. In order to mitigate, or reduce the stress generated at the bottom surface 25 of the housing 2, in those circumstances, opening portions 87, 88 are formed on the bottom surface 25 of the housing 2 at an outward in the direction B of the pillar shaped protrusion portions 85, 86.

Protrusion portions 89, 90 provided at an inner wall 88 of a wall portion 81 of the housing 2 support the core 1 in the direction C at the housing 2. More particularly, by pushing a surface of the core 1 which is in parallel with A-B surface to an inner wall 91 of a wall portion 82 of the housing 2 by means of the protrusion portions 89, 90 in a state where the core 1 is housed in the housing 2, the positioning of the core 1 in the direction C is performed. In this case, the protrusion portions 89, 90 are pushed outwardly in the direction C by means of the core 1. In order to mitigate, or reduce the stress applied to the bottom surface 25 of the housing 2, in those circumstances, opening portions 92, 93 are formed on the bottom surface 25 of the housing 2 along the wall portion 81 and around the protrusion portions 89, 90 (the protrusion portions 89, 90 as a center).

As explained above, the core 1 is fixed to the housing 2 by, for example, press-fitting and thermal clinching, and the core 1 is supported by the housing 2 in the direction A, the direction B, and the direction C. Thus, the positioning of the core 1 relative to the housing 2 is performed with high precision.

Figure 14:
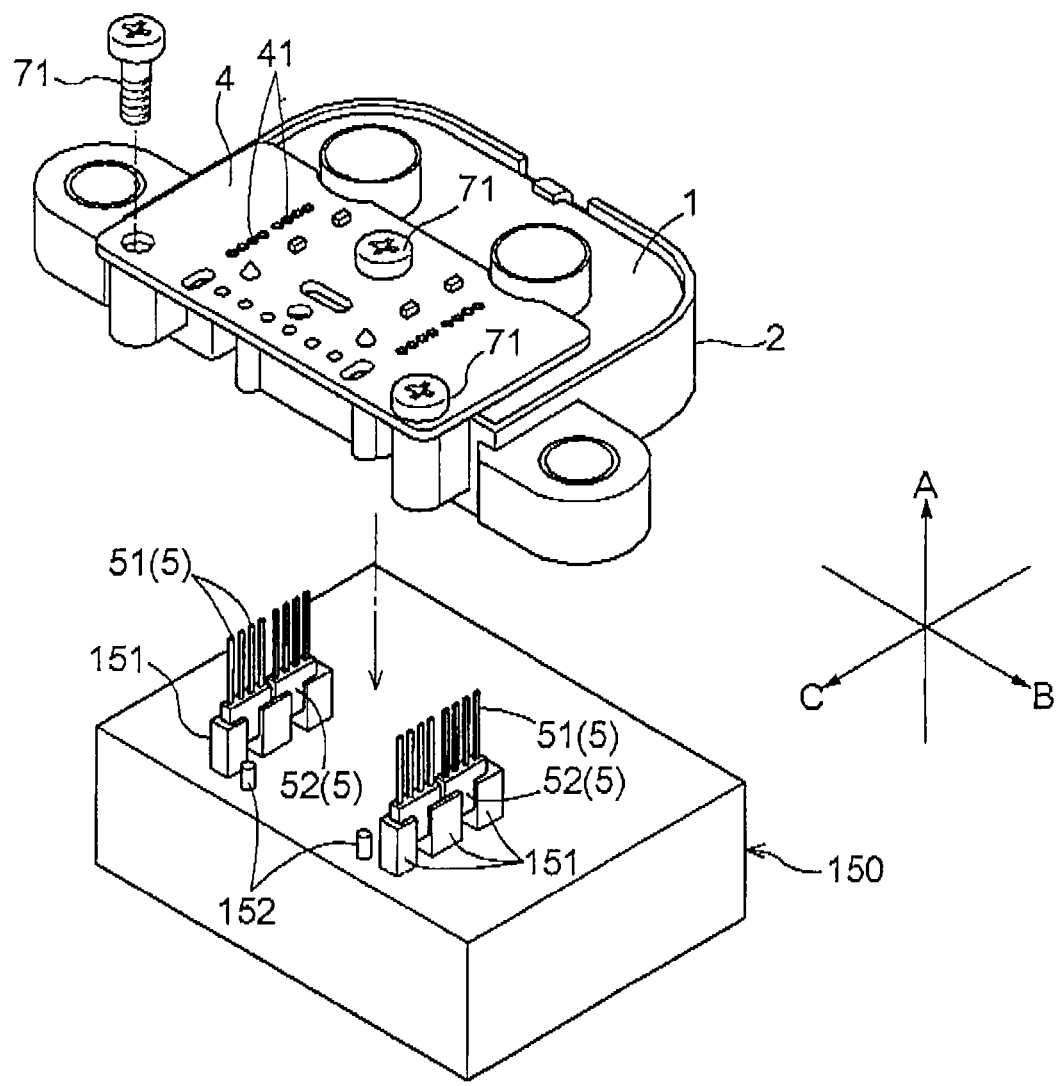
FIG. 14 shows a view in which the circuit board is fixed to the housing according to the embodiment disclosed here.
Figure 15:
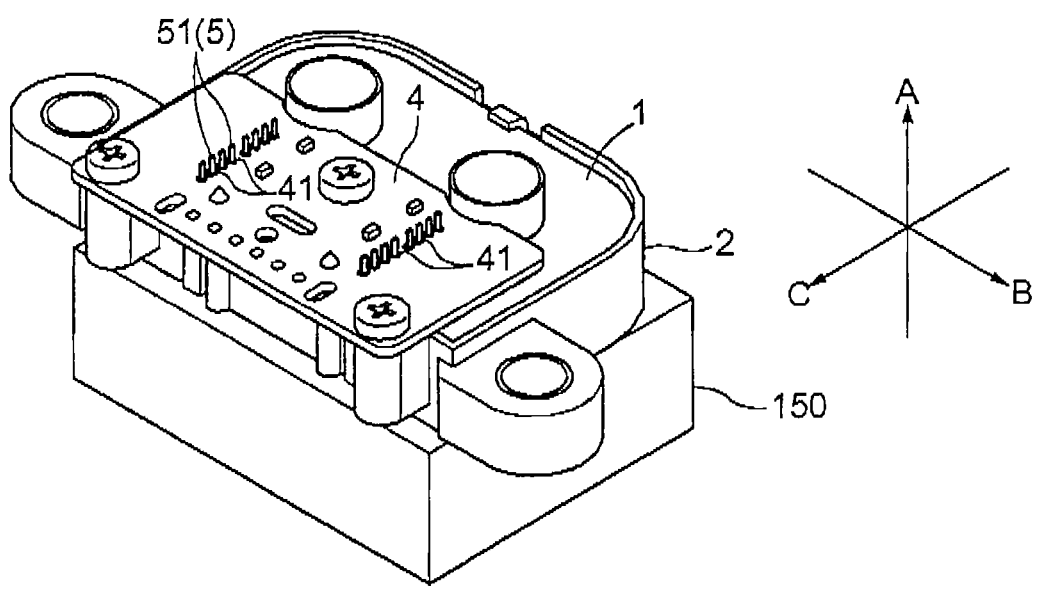
FIG. 15 shows a state where connection terminals of a detection element are inserted to be positioned through the circuit board using a jig according to the embodiment disclosed here.

As illustrated in FIG. 14, the circuit board 4 is fastened to the housing 2, by means of the screws 71, to which the core 1 is assembled. As illustrated in FIGS. 14 and 15, the housing 2 is positioned on the jig 150 at which the detection elements 5 are inserted and positioned in the support portions 151 by fitting the protrusion portions 152 to the positioning holes of the housing 2 as described above. Accordingly, the connection terminals 51 are inserted through the through holes 41 of the circuit board 4 by means of the guide portion 6. Thereafter, the lands 42 of the circuit board 4 and the connection terminals 51 of the detection element 5 are soldered (connected by solder). Then, removing the jig 150, the current sensor 100 is completed.

Modified examples will be explained as follows. According to the embodiment, the core 1 includes two groove portions 11, however, the construction is not limited to the foregoing. Alternatively, the core 1 may include three or more of the groove portions 11. In those circumstances, in order to detect the three-phase alternating current, because the sum of three electric current values is zero in a normal state, one detection element 5 may be provided at each of the groove portions 11 for the purpose of detecting an abnormality, or failure of the detection element 5.

According to the embodiment, the guide portion 6 includes the hole portion 61 and the protrusion portion 62, however, the construction is not limited to the foregoing. Alternatively, the guide portion 6 may include one of the hole portion 61 and the protrusion portion 62. Further, alternatively, the guide portion 6 may be formed in another configuration other than the hole portion 61 and the protrusion portion 62.

According to the embodiment, the clearance is provided between the housing 2 and the circuit board 4 in a state where the circuit board 4 is fixed to the housing 2 so that the solder fillets can be visually inspected along the surface of the circuit board 4. However, the construction is not limited to the embodiment. Alternatively, in a state where the circuit board 4 is fixed to the housing 2, a clearance provided between the housing 2 and the circuit board 4 may be provided at least around the lands 42. According to the alternative construction, the solder fillet is formed at the lands 42 at the front side and backside of the circuit board 4, and the fixing strength of the soldering can be enhanced.

According to the embodiment, the length of the separation wall portion 12 along the distance direction of the core 1 is longer than the length of the outer wall portion 13 along the distance direction. However, the construction is not limited to the embodiment. Alternatively, the length of the separation wall portion 12 in the distance direction of the core 1 and the length of the outer wall portion 13 in the distance direction may be formed to be equal to each other. Further, alternatively, the length of the separation wall portion 12 in the distance direction of the core 1 may be set to be shorter than the length of the outer wall portion 13 in the distance direction.

The disclosure is applicable to a current sensor for measuring the electric current flowing in a conductor.

According to the embodiment, a current sensor includes a core (1), the core (1) being made from magnetic member, the core (1) including a plurality of groove portions (11) and at least one separation wall portion (12) separating the groove portions (11) from one another, a housing (2), the housing (2) being made from a non-magnetic material, the housing (2) covering the core (1) along a contour of the core (1), the housing (2) includes a plurality of recessed grooves (21) formed at the housing (2) along the groove portions (11), respectively, a plurality of conductors (3), the conductors (3) positioned in the groove portions (11), respectively, the conductors (3) allowing a current being measured to flow therein, a circuit board (4), the circuit board (4) fixed to the housing (2), the circuit board (4) including a through hole (41) and a land (42) formed at a surrounding of the through hole (41), the through hole (41) penetrating through the circuit board (4) in a direction corresponding to an inserting direction of the conductor (3), a detection element (5), the detection element (5) detecting a magnitude of a magnetic field generated in accordance with the current being measured flowing in the conductors (3), the detection element positioned in each of the recessed grooves (21), the detection element (5) positioned closer to an opening end side of the groove portion (11) relative to the conductor (3) positioned in the groove portion (11), the detection element (5) being arranged so that a detecting direction of the detection element (5) is directed along a distance direction of the groove portions (11), the detection element (5) including a connection terminal (51), the connection terminal (51) inserted and positioned in the through hole (41), the connection terminal (51) electrically connected to the land (42), and a guide portion (6), the guide portion (6) provided at the housing (2), the guide portion (6) guiding the connection terminal (51) to the through hole (41).

According to the construction of the embodiment, because the circuit board (4) is fixed to the housing (2) that houses the core (1) and the guide portion (6) is provided for inserting the connection terminal (51) of the detection element (5) through the housing (2) to which the circuit board (4) is fixed, the positioning of the detection element (5) relative to the core (1) can be performed with high precision. Thus, because the positional gap, or deviation of the core (1) and the detection element (5) during the manufacturing process can be reduced, the accuracy in the electric current detection can be enhanced. Further, because the connection terminal (51) of the detection element (5) is guided by the guide portion (6) to be inserted through the through hole (41) of the circuit board (4), the detection element (5) can be readily assembled to the circuit board (4). Still further, because the connection terminal is not bent (the connection terminal is not formed by bending process), the length of the connection terminal (51) can be shortened. Thus, the positional deviation, or displacement of the detection element of the detection element (5) by, for example, the vibration, or oscillation can be restrained, and thus the precision in the current detection is enhanced. Further, because the stress is not applied to the joint portion of the connection terminal (51) and the circuit board (4) due to a difference in linear coefficient of expansion, the durability against the thermal shock (flame impingement) can be enhanced.

According to the embodiment, the guide portion (6) includes a hole portion (61). The hole portion (61) is formed at a portion of the recessed groove (21) that opposes to the circuit board (4) and positioned at an opposite side to a side where the circuit board (4) is positioned, and the hole portion (61) includes a diameter that reduces towards an inner in an inserting direction of the connection terminal (51).

According to the construction of the embodiment, the connection terminal (51) of the detection element (5) can be guided to the through hole (41) of the circuit board (4) without bending. Thus, the detection element (51) can be positioned at a predetermined position and the deterioration of the detection precision of the electric current can be prevented.

According to the embodiment, the guide portion (6) includes a protrusion portion (62). The protrusion portion (62) is provided at the housing (2) to protrude in a distance direction of the recessed groove (21), the protrusion portion (62) includes a protrusion amount increasing from an outer side to an inner side in an inserting direction of the connection terminal (51).

According to the construction of the embodiment, because the detection element (4) is guided by the protrusion portion (62) when inserting the detection element (5) inside the recessed groove (21), the detection element (5) can be positioned at a predetermined position in the recessed groove (21). Thus, deterioration of the detection precision of the electric current can be prevented.

According to the embodiment, the circuit board (4) is positioned keeping a distance from the housing (2).

According to the construction of the embodiment, even in a state where the circuit board (4) is fixed to the housing (2), the solder fillet formed at the land (42) formed at the surface of the circuit board (4) facing the housing (2) can be visually inspected. Thus, the reliability of the soldering of the detection element (5) to the circuit board (4) can be enhanced.

According to the embodiment, the core (1) includes outer wall portions (13) positioned interposing said plurality of groove portions (11) in the distance direction therebetween, and a length of the separation wall portion (12) in the distance direction is longer than a length of the outer wall portion (13) in the distance direction.

According to the construction of the embodiment, the magnetic fluxes generated at the separation wall portion (12) and formed by the electric current flowing in two of the conductors (3) positioned interposing the separation wall portion (12) therebetween can be restrained from being influenced each other.

According to the embodiment, the length of the separation wall portion (12) is set to be equal to or longer than a length of the outer wall portion (13) multiplied $\sqrt{3}$.

According to the construction of the embodiment, even when the three-phase alternating current flows in the plural conductors, influence of the magnetic fluxes caused by the electric current flowing in the conductors adjacent each other to each other at the separation wall portion (12) can be reduced. Thus, the detection precision of the three-phase alternating current can be enhanced.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A current sensor, comprising:
 a core, the core being made from magnetic member, the core including a plurality of groove portions and at least one separation wall portion separating the groove portions from one another;
 a housing, the housing being made from a non-magnetic material, the housing covering the core along a contour of the core, the housing including a plurality of recessed grooves formed at the housing along the groove portions, respectively;
 a plurality of conductors, the conductors positioned in the groove portions, respectively, the conductors allowing a current being measured to flow therein;
 a circuit board, the circuit board fixed to the housing, the circuit board including a through hole and a land formed at a surrounding of the through hole, the through hole penetrating through the circuit board in a direction corresponding to an inserting direction of the conductor;
 a detection element, the detection element detecting a magnitude of a magnetic field generated in accordance with the current being measured flowing in the conductors, the detection element positioned in each of the recessed grooves, the detection element positioned closer to an opening end side of the groove portion relative to the conductor positioned in the groove portion, the detection element being arranged so that a detecting direction of the detection element is directed along a distance direction of the groove portions, the detection element including a connection terminal, the connection terminal inserted and positioned in the through hole, the connection terminal electrically connected to the land; and
 a guide portion, the guide portion provided at the housing, the guide portion guiding the connection terminal to the through hole.

2. The current sensor according to claim 1, wherein
 the guide portion includes a hole portion;
 the hole portion is formed at a portion of the recessed groove that opposes to the circuit board and positioned at an opposite side to a side where the circuit board is positioned, and the hole portion includes a diameter that reduces towards an inner in an inserting direction of the connection terminal.

3. The current sensor according to claim 1, wherein
 the guide portion includes a protrusion portion;
 the protrusion portion is provided at the housing to protrude in a distance direction of the recessed groove, the protrusion portion includes a protrusion amount increasing from an outer side to an inner side in an inserting direction of the connection terminal.

4. The current sensor according to claim 1, wherein the circuit board is positioned keeping a distance from the housing.

5. The current sensor according to claim 1, wherein the core includes outer wall portions positioned interposing said plurality of groove portions in the distance direction therebetween, and a length of the separation wall portion in the distance direction is longer than a length of the outer wall portion in the distance direction.

6. The current sensor according to claim 5, wherein the length of the separation wall portion is set to be equal to or longer than a length of the outer wall portion multiplied by $\sqrt{3}$.

* * * * *